(12) United States Patent
Moon

(10) Patent No.: US 6,621,303 B2
(45) Date of Patent: Sep. 16, 2003

(54) OUTPUT DRIVER HAVING REDUCED POWER CONSUMPTION AND LAYOUT AREA

(75) Inventor: Byong-mo Moon, Seoul (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/947,467

(22) Filed: Sep. 7, 2001

(65) Prior Publication Data

US 2002/0047725 A1 Apr. 25, 2002

(30) Foreign Application Priority Data

Sep. 20, 2000 (KR) ......................................... 2000-55203

(51) Int. Cl.[7] ......................... H03K 19/00; H03K 17/14
(52) U.S. Cl. ............................ 326/93; 326/32; 327/378
(58) Field of Search ............................... 326/83, 87, 113, 326/93, 95, 98, 32; 327/378, 512, 538

(56) References Cited

U.S. PATENT DOCUMENTS 5,331,220 A * 7/1994 Pierce et al. ................. 307/475
5,489,858 A * 2/1996 Pierce et al. ................... 326/56

* cited by examiner

*Primary Examiner*—Daniel Chang
(74) *Attorney, Agent, or Firm*—Volentine Francos, PLLC

(57) ABSTRACT

An output driver of a semiconductor integrated circuit having low power consumption and reduced layout area transmits internally generated data of the circuit to pads responsive to clock signals, and is controlled by control signals indicative of changes of process, voltage, and temperature. The output driver includes a data selector, an output driver enabler, a first driver that transmits an output of the output driver enabler to the pads, and a second driver that includes a data delay having a plurality of inverters connected in series to an output of the output driver enabler and being activated responsive to the control signals. The second driver transmits an output of the data delay to the pads. The output driver reduces a load on the clock signal line, so that power consumption and a layout area can be reduced.

21 Claims, 5 Drawing Sheets

OUTPUT DRIVER HAVING REDUCED POWER CONSUMPTION AND LAYOUT AREA

The present application claims priority under 35 U.S.C. §119 to Korean Application No. 2000-55203 filed on Sep. 20, 2000, which is hereby incorporated by reference in its entirety for all purposes.

BACKGROUND OF THE INVENTION

1. Field of the Invention

The present invention relates to a semiconductor integrated circuit, and more particularly, to an output driver that lowers power consumption and reduces layout area.

2. Description of the Related Art

A semiconductor integrated circuit, for example, a Rambus-DRAM, uses an open-drain method for transmitting data generated by the integrated circuit to an output pad. The open-drain method is one of numerous data transmitting methods, and includes as shown in FIG. 1 a structure in which a pull down transistor 6 is connected to an output pad (PAD). When data generated inside of a chip is transmitted to the PAD in response to enable signals (EN), if an output of an inverter 4 is a logic high level, the pull down transistor 6 turns on, and the voltage level at the PAD becomes a logic low VOL (Vterm-$I_{OL}$×Rterm) level. If the output of the inverter 4 is logic low, the pull down transistor 6 turns off, and the voltage level at the PAD becomes VOH by an external voltage (Vterm) through a resistance (Rterm) connected to the PAD outside the chip. Thus, the PAD becomes logic high. Therefore, the PAD becomes logic high identical to the data inside the chip. The open-drain method can also be realized by a method of connecting a pull up transistor, instead of the pull down transistor 6 connected to the PAD of FIG. 1. Incidentally, the data generated inside the chip and the enable signal EN are input to a logical NAND gate, which provides an output therefrom to inverter 4.

In FIG. 1, the inverter 4 plays the role of a pre-driver which transmits the data generated by the chip to the pull down transistor 6, and thus operates the pull down transistor 6. Here, the inverter 4 and the pull down transistor 6 become an output driver 10. Particularly, the inverter 4 directly operates the pull down transistor 6, and the operating capability of inverter 4 thus determines how fast the pull down transistor 6 turns on to enable the voltage level at the PAD to become VOL, that is a logic low level. The operating capability of the inverter 4 is determined not only by the size and the width/length of the inverter 4 itself, but also by changes to the threshold voltage, the operating voltage, and temperature according to a semiconductor manufacturing process.

For example, the operating capability of the transistors, which form the inverter 4 as having a raised threshold voltage or a lowered voltage, can be lowered. It would then take a long time to swing a gate voltage level of the pull down output transistor to logic high, so that the switching speed of the pull down transistor becomes slower. As a result, the operating speed of a semiconductor memory device having an open-drain output terminal of FIG. 1 becomes slower. To solve this problem, an output driver such as that shown in FIG. 2 is used.

The output driver 200 of FIG. 2 includes a first data selector 210, a second data selector 220, a first output driver enabler 230, a second output driver enabler 240, a first operator 250, and a second operator 260. The first data selector 210 operates in accordance with clock signals (CLK, CLKB) and the second data selector 220 operates in accordance with delay clock signals (CLK_DLY, CLKB_DLY), and the first and second data selectors 210 and 220 select the data generated by the chip, that is, even-numbered data or odd-numbered data. The delay clock signals (CLK_DLY, CLKB_DLY) are generated respectively by clock delays 270 and 280 based on control signals (S1, S2), by sensing changes in a semiconductor manufacturing process, voltage and temperature. In the first and second operators 250, 260, the gate voltage level of output transistors 251, 261 is sufficiently high, in response to complex control signals (S1, S2), to induce a fast switching of the output transistors 251, 261.

However, since in this output driver 200, clock signal lines are connected to clock delays 270 and 280 that generate delay clock signals (CLK_DLY, CLKB_DLY), a line load on clock signals (CLK, CLKB) appears large. If the operating frequency is high, the line load causes a problem by consuming too much power. In addition, because two data selectors 210, 220 are necessary, layout area becomes large. Therefore, an output driver having lower power consumption and reduced layout area is required.

SUMMARY OF THE INVENTION

The present invention is therefore directed to an output driver having reduced power consumption and layout area, which substantially overcomes one or more of the problems due to the limitations and disadvantages of the related art.

To solve the above problems, it is an object of the present invention to provide an output driver capable of lowering power consumption and reducing layout area.

Accordingly, to achieve the above and other objects, there is provided an output driver controlled by control signals and which transmits internally generated data to pads, and which senses changes in process, voltage, and temperature, in response to clock signals, including: a data selector that selects the internally generated data in response to clock signals, an output driver enabler that outputs data selected by the data selector in response to output driver enable signals, a first driver that transmits the output of the output driver enabler to pads, a data delay that delays the output of the output driver enabler for a predetermined time in response to control signals, and a second driver that transmits the output of the data delay to pads.

The data selector may be configured to select even-numbered data from the internally generated data in response to clock signals, and to select odd-numbered data from the internally generated data in response to inverted signals of the clock signals.

According to a preferred embodiment, the data delay includes: a first inverter chain, in which a plurality of inverters are connected in series between an output of the output driver enabler and an input of the second driver, and a second inverter chain, in which a plurality of inverters, activated in response to control signals between a middle node of the inverter chain and an input of the second driver, are connected in series.

According to another preferred embodiment, the data delay includes: a first inverter chain, in which a plurality of inverters between an output of the output driver enabler and an input of the second driver are connected in series, and a second inverter chain, in which a plurality of inverters, activated in response to control signals between an output of the output driver enabler and an input of the second driver, are connected in series. A middle node of the first inverter chain and a middle node of the second inverter chain are connected to each other.

According to the output driver of the present invention, the layout area can be reduced by removing the conventional data selector, and power consumption can be lowered by reducing the line load of the clock signals, because the delay clock signals need not be generated from the clock signals.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
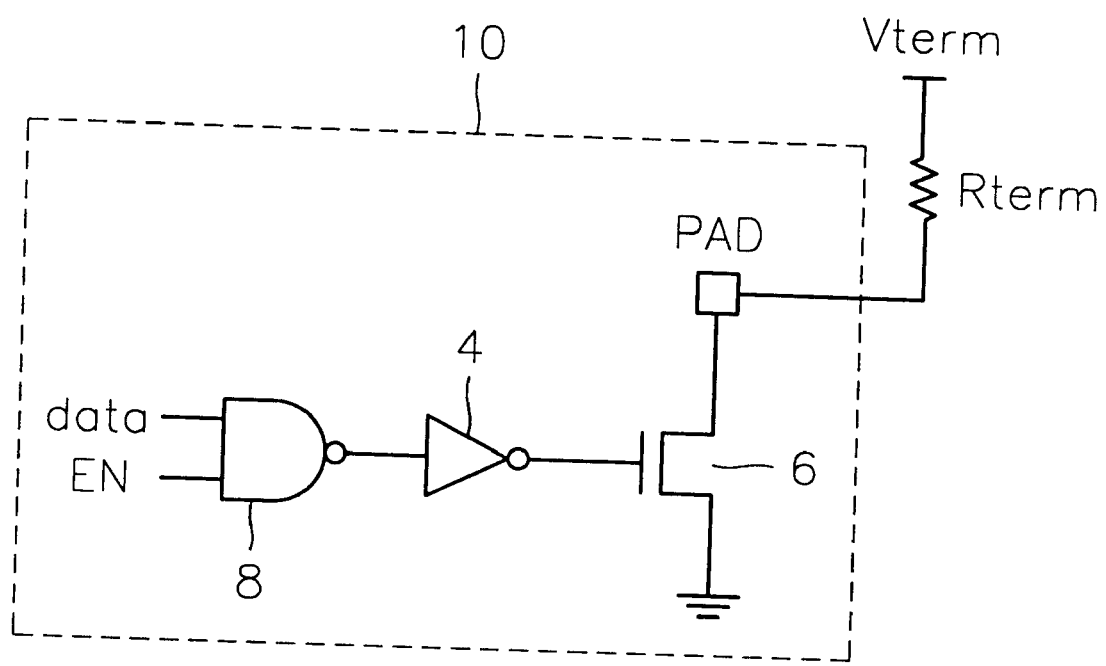
FIG. 1 illustrates a conventional open-drain output terminal.

To fully understand the advantages of the present invention and the operation of the present invention, and objectives achieved by the preferred embodiments of the present invention, the appended drawings illustrating the preferred embodiments of the present invention and the contents mentioned in the appended drawings must be referred to. Hereinafter, the preferred embodiments of the present invention will be described in greater detail with reference to the appended drawings. The same reference numerals in the respective drawings indicate the same elements performing the same functions.

Figure 3:
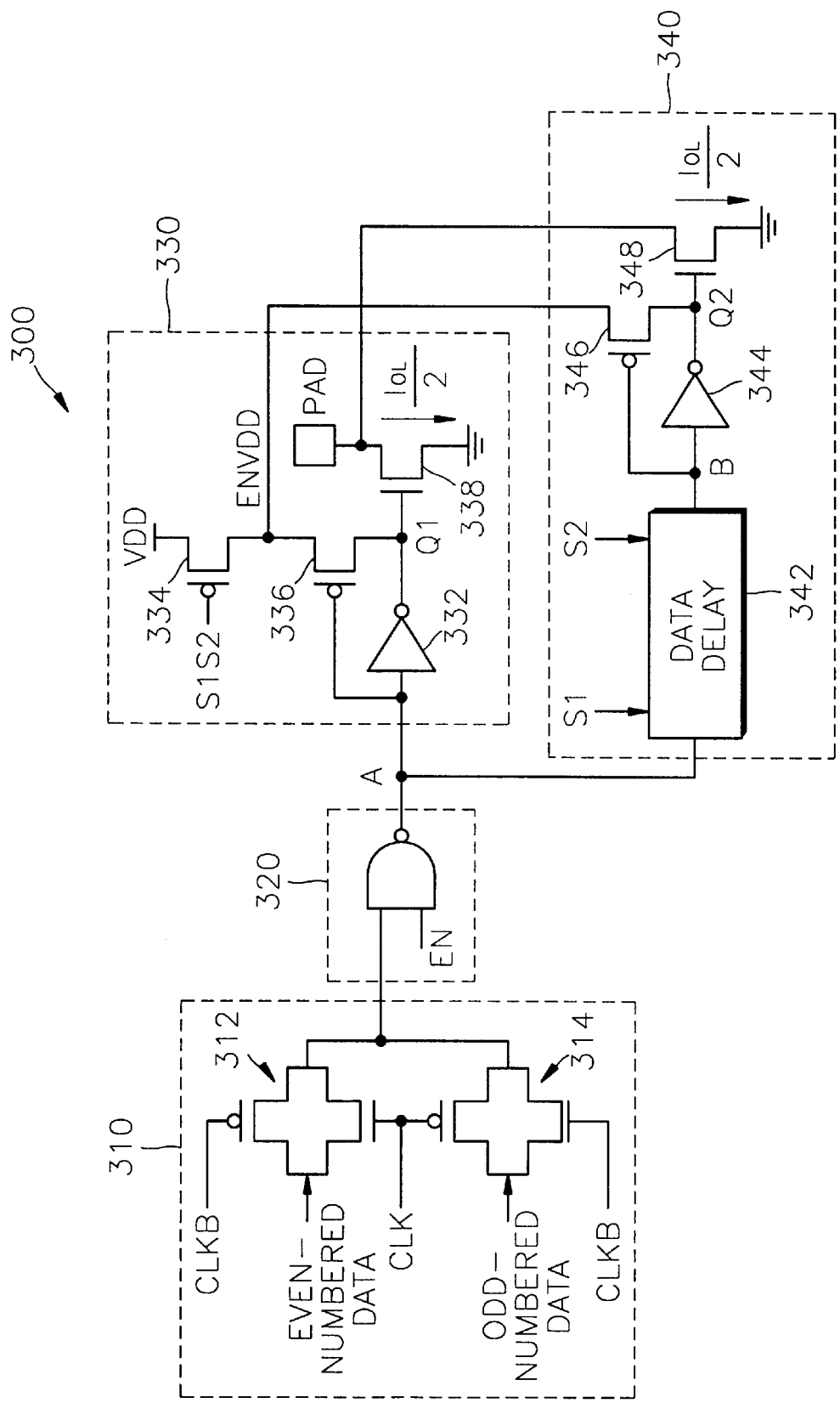
FIG. 3 illustrates an output driver according to a preferred embodiment of the present invention.

FIG. 3 illustrates an output driver according to a preferred embodiment of the present invention. Referring to FIG. 3, the output driver 300 includes a data selector 310, an output driver enabler 320, a first driver 330, and a second driver 340. The data selector 310 selects data provided from or generated from the inside of a chip, in response to clock signals (CLK, CLKB). That is, in the data selector 310, when the clock signal (CLK) is a logic high and the reverse clock signal (CLKB) is a logic low, a first transmit gate 312 turns on to output even-numbered data, and when the clock signal (CLK) is a logic low and the reverse clock signal (CLKB) is a logic high, a second transmit gate 314 turns on to output odd-numbered data. The even-numbered data and odd-numbered data mean data corresponding to a burst length of a semiconductor memory device, from the view point of operation characteristics of the semiconductor memory device, particularly a synchronous DRAM, and sequentially indicate the data.

The output driver enabler 320 transmits an output of the data selector 310 to the first driver 330 and the second driver 340, in response to enable signals (EN). The output driver enabler 320 may be formed of 2-input NAND gates that are enabled to transmit data output from the data selector 310 when the enable signal (EN) is a logic high.

The first driver 330 operates to provide an output of the output driver enabler 320 at the PAD, in response to complex control signals (S1, S2). The complex control signals (S1, S2) are control signals that corresponds to first control signal (S1) and second control signal (S2). The first control signal (S1) is generated for example to compensate for element features such as a decrease in the MOS current operating capability caused by a change in the manufacturing process of the device, and the second control signal (S2) is a control signal generated for example to compensate for element features such as a decrease in MOS current operating capability caused by a reduction in the voltage of the device. Therefore, the complex control signals (S1, S2) are signals which compensate for changes in element features according to changes in manufacturing process and voltage. The complex control signals (S1, S2) can be controlled to compensate for changes in temperature, in addition to changes in process and voltage.

Particularly, the first driver 330 provides the voltage (VDD) at an activated voltage terminal (ENVDD) through a current operating transistor 334 which responds to a logic low level of the complex control signals (S1, S2). The level of node Q1 is determined by a first switching transistor 336 and an inverter 332 in correspondence with the level of a node A, wherein node A is an output of the output driver enabler 320. That is, the first switching transistor 336 is turned off by a logic high level provided at node A, and the node Q1 becomes a logic low level through the inverter 332. A logic low level at node A results in the node Q1 becoming a logic high level through the inverter 332, and the first switching transistor 336 is turned on by the logic low level at node A, so that a level of the activated voltage terminal (ENVDD) is also provided to the node Q1. At the node Q1, the voltage level provided by the first inverter 332 and the voltage level of the activated voltage terminal (ENVDD) are added together. Therefore, the node Q1 secures a stable voltage level about a change of reduction of the voltage (VDD).

The voltage level of the PAD is determined by operation of a first output transistor 338 in accordance with a voltage level of the node Q1. The first output transistor 338 is turned off by a logic low level at the node Q1, and the PAD then assumes a logic high level having a terminal voltage (Vterm) level through an external terminal resistance such as Rterm in FIG. 1. The first output transistor 338 is turned on by a logic high level at the node Q1, and the PAD then assumes a logic low level. Here, the size of the first output transistor 338 is determined so that a current half of a DC regulation current $I_{OL}$ can flow. For example, if the size of an output transistor 6 of FIG. 1 is 100 W/L and satisfies $I_O$, the first transistor 330 of FIG. 3 is determined to be 50 W/L to satisfy $I_{OL}/2$.

The second driver 340 includes a data delay 342 for delaying signals at the node A corresponding to an output of the output driver enabler 320, for a predetermined time. The second driver 340 also includes a second switching transistor 346 operative responsive to a logic level at node B which corresponds to an output of the data delay 342, and includes a second inverter 344. The logic level at node Q2 is determined by the data delay 342 and the second switching transistor 346. The voltage level at the PAD is determined by operation of a second output transistor 348 responsive to the voltage level at the node Q2. It is to be understood that data delay 342 may be provided separately from second driver 340.

Here, the operation of the second switching transistor 346, the second inverter 344, and the second output transistor 348 is almost the same as the operation of the first switching transistor 336, the first inverter 332, and the first output transistor 338 within the first driver 330. The only substantial difference is the time of operation, because the second switching transistor 346, the second inverter 344 and the second output transistor 348 are operated responsive to the logic level at the node B, which is delayed with respect to the logic level at the node A for a predetermined time. Therefore, in order to avoid duplication of description, a detailed description of the operation of these elements will be omitted. The second output transistor 348 within the second driver 340 has a size satisfying $I_{OL}/2$, similar to the first output transistor 338 within the first driver 330.

The data delay 342 delays the signals at the node A for a predetermined time in response to the first and second control signals (S1, S2). The data delay 342 can be embodied in various ways, and the present invention will be described with reference to three examples.

Figure 4A:
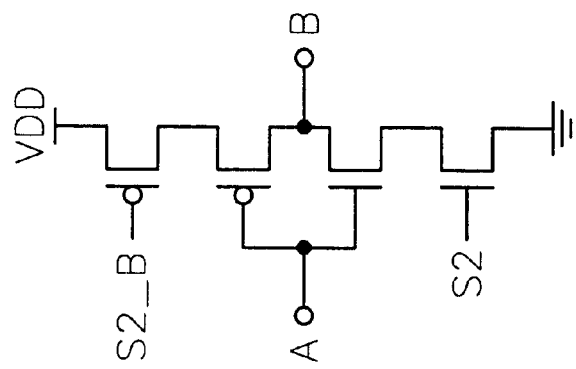
FIG. 4A illustrates the details of an inverter used in the data delay of FIG. 4.
Figure 4:
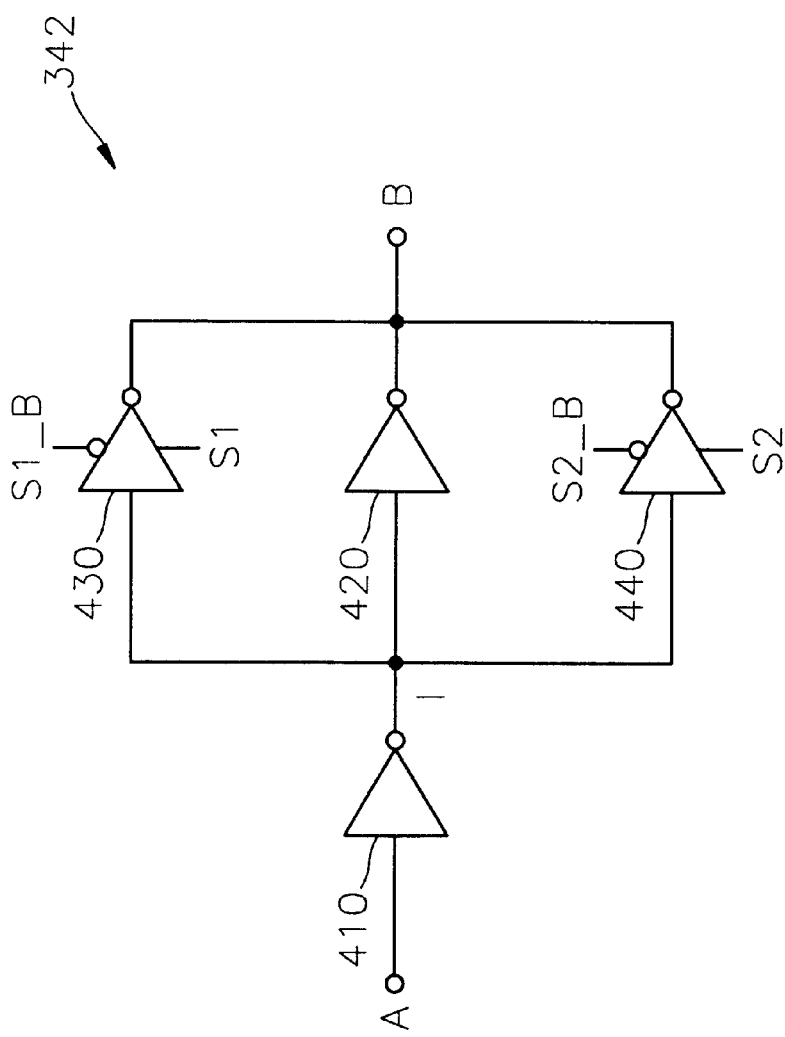
FIG. 4 illustrates a preferred embodiment of the data delay of FIG. 3.

FIG. 4 illustrates an example of the data delay 342. Referring to FIG. 4, the data delay 342 includes inverters 410, 420 forming an inverter chain between the node A and the node B. Between a middle node I of the inverter chain 410, 420 and the node B, inverters 430, 440 are connected in rows, or in parallel with respect to the inverter 420. The inverters 430, 440 are activated responsive to the first control signals (S1, S1_B) and the second control signals (S2, S2_B), respectively. Incidentally, FIG. 4A illustrates the details of an inverter used in data delay 342, particularly inverter 440 for example.

Figure 5:
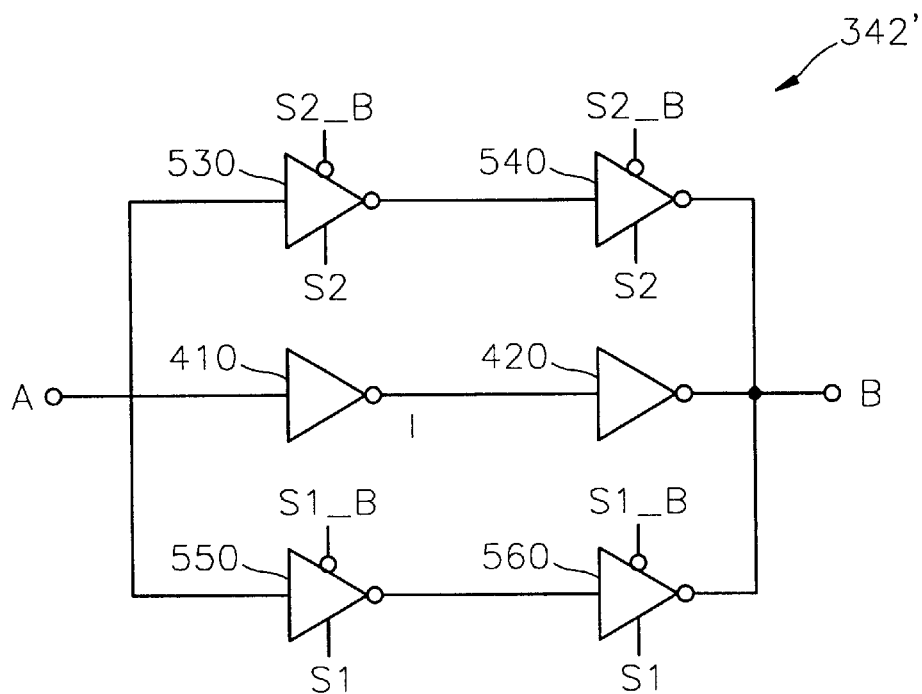
FIG. 5 illustrates another preferred embodiment of the data delay of FIG. 3.

FIG. 5 illustrates another data delay 342'. Referring to FIG. 5, the data delay 342'includes inverters 410, 420 forming an inverter chain between the node A and the node B, and inverter chains 530, 540 and 550, 560 connected in rows to be in parallel with respect to the inverter chain including the inverters 410, 420. The inverter chains 530, 540 and 550, 560 are activated responsive to the second control signals (S2, S2_B) and the first control signals (Si, S1_B), respectively.

Figure 6:
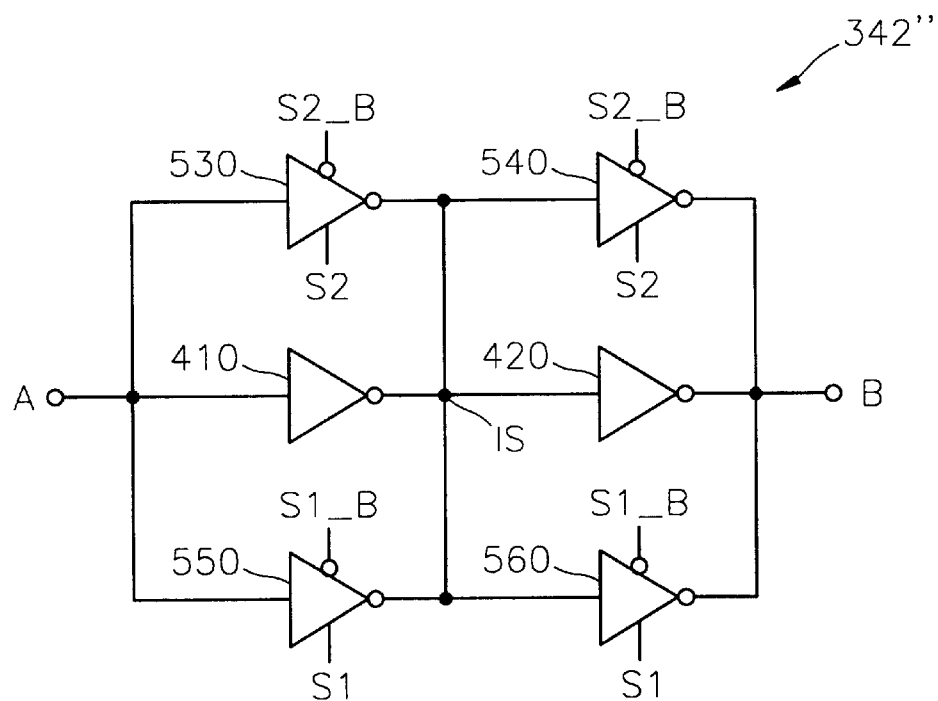
FIG. 6 illustrates another preferred embodiment of the data delay of FIG. 3.

FIG. 6 illustrates another data delay 342", which includes the same elements and is configured similarly as data delay 342' of FIG. 5. However, the middle nodes of the inverter chains 410, 420; 530, 540; and 550, 560 are commonly coupled together at the middle node Is.

The data delays of FIGS. 4, 5, and 6 (342, 342', and 342") each include respective routes for compensating the voltage level at the node B respectively with control signals (S1, S2) generated in view of the changes in manufacturing process and voltage. A normal route is also included in each of the data delays wherein the signals at the node A are merely delayed through the general inverter chains 410, 420 for a predetermined time and transmitted to the node B.

Figure 2:
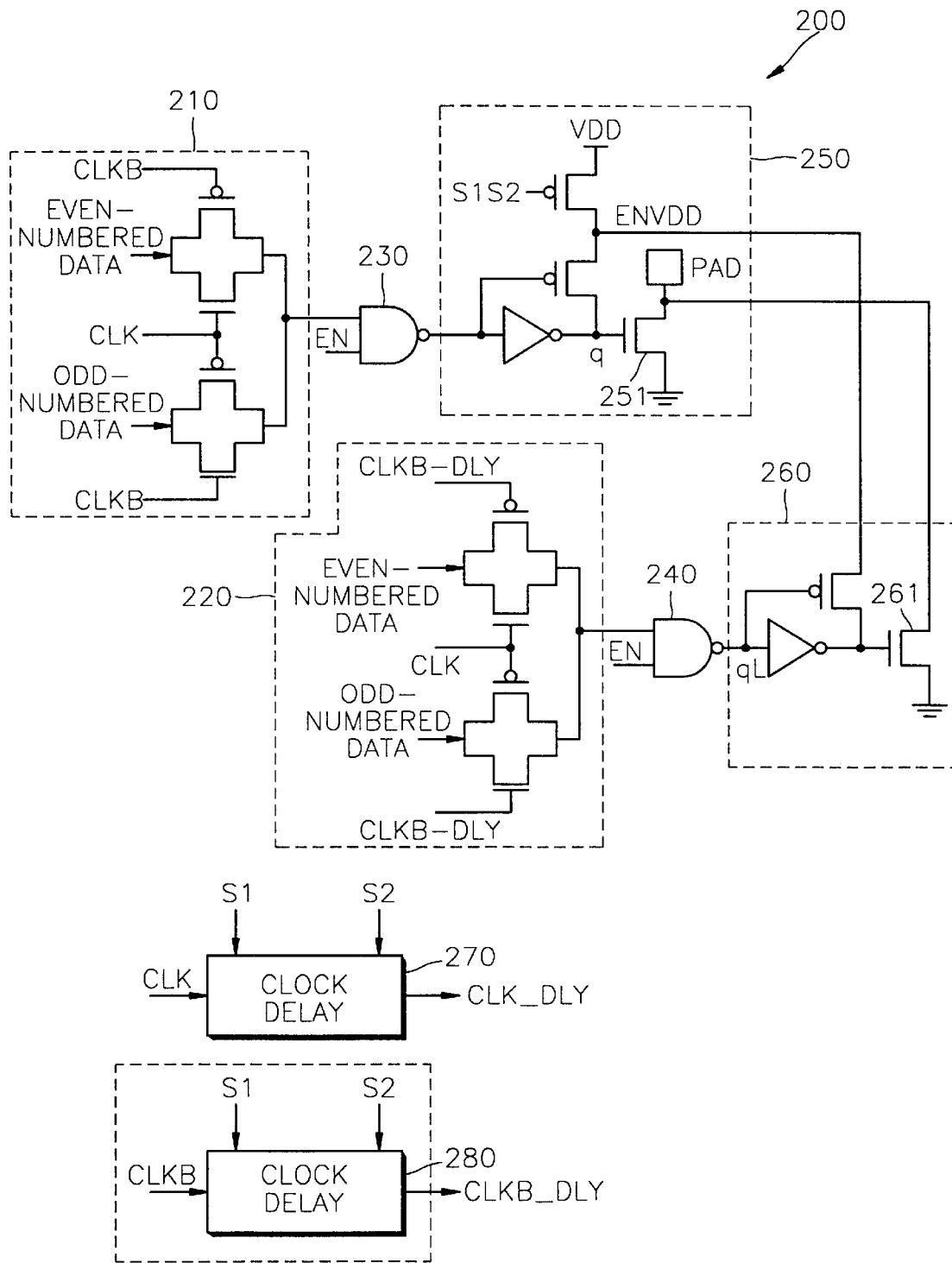
FIG. 2 illustrates a conventional output driver.

Accordingly, the output drivers of the present invention have reduced layout area because the second data selector 220 of FIG. 2 is not included. Also, the line load on clock signals (CLK, CLKB) may be reduced because generation of the delay clock signals (CLK_DLY, CLKB_DLY) from the clock signals (CLK, CLKB) is unnecessary, so that power consumption can be lowered.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An output driver, which transmits data to a pad in response to clock signals, and which is controlled by control signals indicative of changes in manufacturing process, voltage, and external temperature, comprising:
   a data selector that selects the data in response to the clock signals;
   an output driver enabler that outputs data selected by said data selector in response to an enable signal;
   a first driver that transmits an output of said output driver enabler to a pad;
   a data delay that delays the output of said output driver enabler for a time in response to the control signals; and
   a second driver that transmits an output of said data delay to the pad.

2. The output driver of claim 1, wherein said data selector selects even-numbered data from the data in response to the clock signals, and selects odd-numbered data from the internally in response to inverted clock signals.

3. The output driver of claim 1, wherein said data delay comprises:
   a first inverter chain including a plurality of inverters connected in series between the output of said output driver enabler and an input of said second driver; and
   a second inverter chain, including a plurality of inverters activated in response to the control signals and connected in series between a middle node of said first inverter chain and the input of said second driver.

4. The output driver of claim 1, wherein said data delay comprises:
   a first inverter chain including a plurality of inverters connected in series between the output of said output driver enabler and an input of said second driver; and
   a second inverter chain including a plurality of inverters activated in response to the control signals and connected in series between the output of said output driver enabler and the input of said second driver.

5. The output driver of claim 4, wherein a middle node of said first inverter chain is coupled to a middle node of said second inverter chain.

6. An output driver for a semiconductor device comprising:
   a data selector that selects data generated by the semiconductor device, responsive to a clock signal;
   an output driver enabler, coupled to said data selector, that outputs the selected data responsive to an enable signal;
   a first driver that transmits an output of said output driver enabler to a pad of the semiconductor device responsive to control signals;
   a data delay that delays the output of said output driver enabler for a time period responsive to the control signals; and
   a second driver that transmits an output of said data delay to the pad.

7. The output driver of claim 6, wherein said data delay comprises:
   a first inverter chain including a plurality of inverters coupled in series between said output driver enabler and said second driver; and
   a plurality of second inverter chains each including a plurality of inverters coupled in series between said output driver enabler and said second driver.

8. The output driver of claim 7, wherein said plurality of second inverter chains are respectively operable responsive to the control signals.

9. The output driver of claim 8, wherein said first inverter chain is operable independent of the control signals.

10. The output driver of claim 7, wherein a middle node of said first inverter chain is coupled to respective middle nodes of said plurality of second inverter chains.

11. The output driver of claim 6, wherein said data delay comprises:
    a first inverter chain coupled in series between said output driver enabler and said second driver; and
    a plurality of second inverter chains including a plurality of inverters coupled in series between a middle node of said first inverter chain and said second driver.

12. The output driver of claim 11, wherein said plurality of second inverter chains are respectively operable responsive to the control signals.

13. The output driver of claim 12, wherein said first inverter chain is operable independent of the control signals.

14. The output driver of claim 6, wherein the control signals are indicative of changes in a manufacturing process of the semiconductor device, voltage, and external temperature.

15. The output driver of claim 6, wherein the semiconductor device is synchronous DRAM.

16. The output driver of claim 6, wherein said data selector selects even-numbered data generated by the semiconductor device, responsive to the clock signal, and selects odd-numbered data generated by the semiconductor device, responsive to an inverted clock signal.

17. A method of driving an output of a semiconductor device comprising:
    selecting data generated by the semiconductor device responsive to a clock signal;
    enabling the selected data responsive to an enable signal;
    providing the enabled data to a pad of the semiconductor device responsive to control signals;
    delaying the enabled data for a time period responsive to the control signals; and
    providing the delayed data to the pad.

18. The method of driving an output of claim 17, wherein said delaying the enabled data comprises:
    delaying the enabled data through a first inverter chain including a plurality of inverters coupled in series, independent of the control signals, to provide first delayed data;
    delaying the enabled data through a plurality of second inverter chains each including a plurality of inverters coupled in series, responsive to the control signals, to provide second delayed data; and
    providing the first delayed data and the second delayed data as the delayed data.

19. The method of driving an output of claim 18, wherein a middle node of the first inverter chain is coupled to respective middle nodes of the plurality of second inverter chains.

20. The method of driving an output of claim 17, wherein said delaying the enabled data comprises:
    delaying the enabled data through a first inverter chain including a plurality of inverters coupled in series, independent of the control signals, to provide first delayed data;
    delaying the enabled data through a plurality of second inverter chains including a plurality of inverters coupled in series to a middle node of the first inverter chain, responsive to the control signals, to provide a second delayed data; and
    providing the first delayed data and the second delayed data as the delayed data.

21. The method of driving an output of claim 17, wherein the control signals are indicative of changes in a manufacturing process of the semiconductor device, voltage, and external temperature.

* * * * *